(12) United States Patent
Hsiao et al.

(10) Patent No.: US 7,915,114 B2
(45) Date of Patent: *Mar. 29, 2011

(54) LOW TEMPERATURE PROCESS FOR TFT FABRICATION

(75) Inventors: Mark Hsiao, Tracy, CA (US); Dong-Kil Yim, Sungnam (KR); Takako Takehara, Hayward, CA (US); Quanyuan Shang, Saratoga, CA (US); William R. Harshbarger, San Jose, CA (US); Woong-Kwon Kim, Kyungki-do (KR); Duk-Chul Yun, Seoul (KR); Youn-Gyung Chang, Kyungki-do (KR)

(73) Assignee: Applied Materials, Inc., Santa Clara, CA (US)

( * ) Notice: Subject to any disclaimer, the term of this patent is extended or adjusted under 35 U.S.C. 154(b) by 118 days.

This patent is subject to a terminal disclaimer.

(21) Appl. No.: 11/946,040

(22) Filed: Nov. 27, 2007

(65) Prior Publication Data

US 2008/0087960 A1    Apr. 17, 2008

Related U.S. Application Data

(63) Continuation of application No. 10/453,333, filed on Jun. 2, 2003, now Pat. No. 7,300,829.

(51) Int. Cl.
*H01L 21/8238* (2006.01)
(52) U.S. Cl. .................. 438/216; 257/E21.422
(58) Field of Classification Search ............. 438/216; 257/E21.422
See application file for complete search history.

(56) References Cited

U.S. PATENT DOCUMENTS

| | | | | |
|---|---|---|---|---|
| 5,849,643 | A * | 12/1998 | Gilmer et al. | 438/773 |
| 6,661,065 | B2 * | 12/2003 | Kunikiyo | 257/411 |
| 7,300,829 | B2 * | 11/2007 | Hsiao et al. | 438/151 |

OTHER PUBLICATIONS

Seiichi Isomae et al., "Cavity Formation Due to Si3N4/SiO2 Film-Induced Stress in Silicon", Jan. 1997, Journal of Electrochemical Society, vol. 144, No. 1, pp. 340-345.*
Seiichi Isomae, "Stress in Silicon at Si3N4/SiO2 film edges and viscoelastic behavior of SiO2 Films", Jan. 15, 1985, Journal of Applied Physics, vol. 57, No. 2, pp. 216-223.*

* cited by examiner

*Primary Examiner* — W. David Coleman
(74) *Attorney, Agent, or Firm* — Robert J. Stern

(57) ABSTRACT

Method of fabricating a thin-film transistor (TFT) in which a gate metal is deposited onto a substrate in order to form the gate of the thin-film transistor. The substrate may be an insulative substrate or a color filter. In a first method, the gate metal is subjected to an $H_2$ plasma. After subjecting the gate metal to an $H_2$ plasma, the gate insulating film is deposited onto the gate. In a second method, first and second layers of gate insulating film are respectively deposited on the gate at a first and second deposition rates. One layer is deposited under $H_2$ or argon dilution conditions and has improved insulating conditions while the other layer serves to lower the overall compressive stress of the dual layer gate insulator. In a third method, an $n^+$ silicon film is formed on a substrate by maintaining a flow of silane, phosphine and hydrogen gas into a processing chamber at substrate temperatures of about 300° C. or less.

22 Claims, 4 Drawing Sheets

LOW TEMPERATURE PROCESS FOR TFT FABRICATION

CROSS REFERENCE TO RELATED APPLICATION

This patent application is a continuation of application Ser. No. 10/453,333 filed Jun. 2, 2003, now U.S. Pat. No. 7,300,829 issued Nov. 27, 2007.

FIELD OF THE INVENTION

The present invention relates to improved methods for fabricating thin film transistors (TFTs) that use substrates such as glass, quartz, or plastic. Such TFTs are used in a number of devices, such as liquid-crystal displays. The invention also relates to TFTs that are fabricated in accordance with the improved methods.

BACKGROUND OF THE INVENTION

Ever since the first appearance of amorphous silicon (a-Si) thin-film transistors (TFT)-liquid crystal displays (LCDs) in notebook personal computers more than ten years ago, the number of applications for (a—Si) TFT-LCD has expanded. Fueling this expansion is the increase in screen area and the resolution of (a-Si) TFT-LCD-based display devices. Presently, (a-Si) TFT-LCD-based display devices are found in notebook PCs, modern desktop monitors, televisions, and advanced game equipment. Although the major application of the TFT technology is currently in LCDs, there are many other microelectronic products that could benefit from (a-Si) thin-film transistor technology. For example, a large-area x-ray imager has been successfully fabricated by integrating (a-Si) TFTs with p-i-n photodiodes over a glass substrate coated with an x-ray converter material. High-resolution phantoms of the foot and the head can be recorded with this type of imager. In addition, p-channel TFTs have been used to replace high-resistance loads in static random access memory (SRAM) devices, leading to improved cell stability, low standby current, and reduced cell area. In another example, high-density and high-response-speed printer and fax machines fabricated with TFTs have also been demonstrated. By varying the gate-metal material and the operating conditions, the TFT can be used as a chemical sensor, e.g., to detect changes in gas-phase hydrogen concentration or liquid-phase potassium concentration. Many other devices based on TFT technology, such as the artificial retina or the EEPROM, have also been demonstrated.

The expansion of the role of (a-Si) TFT-based displays in electronic devices has required improvements in the size of the glass substrate used in such displays as well as the production of ever smaller individual TFT structures. The configuration of a typical TFT-LCD-based display, an active matrix display, is shown in FIG. 1. The display operates in the transmission mode with a fluorescent lamp 102 behind panel 104. The panel consists of two glass plates: the bottom and top glass substrates (106, 108). Liquid crystal material is injected between these two glass plates, filling a small gap (on the order of several micrometers) with extreme uniformity. In general, twisted nematic (TN) LC mode is used, so the panel needs a polarizer film 112, 114 on the outer surface of each glass substrate.

Each pixel of the display is driven by an individual a-Si TFT. In FIG. 1, the TFTs are arranged in an x-y matrix formed on the bottom glass substrate. Each TFT operates as an analogue switch to control the stored charge in an LC capacitor defined between an electrode on the bottom substrate and a common electrode on the top substrate. A color filter layer on the top glass substrate consists of three primary chromaticities: red, green, and blue. Each pixel electrode is aligned with a single color of the color filter layer.

While the display-performance and screen size of TFT-LCD displays keeps improving, a critical problem in the TFT-LCD market is the cost of manufacturing such displays. Cost improvements are needed before TFT-LCD displays can effectively replace cathode ray tube based displays in many markets. One approach to lowering manufacturing costs is to fuse the color filter and the TFT array together. See, for example, Sakamoto et al., 1999, *AM-LCD Digest*, p. 193; Maruyama et al., 1999, *EuroDisplay '99, Late-news Digest*, p. 77; Hayama et al., 2000, *SID '00 Digest*, p. 1112; Song et al., 2000, *SID '00 Digest*, p. 1018. While the technique of fusing the color filter and the TFT array together is beneficial because of lower production costs, the technique imposes limitations on the maimer in which the TFT array can be built. Color filters are typically made from organic materials. Because of the sensitivity of organic materials to temperature, the color filter cannot withstand temperatures exceeding 300° C. for any appreciable amount of time. In order to improve the process window for fused TFT array/color filters, Hong et al. report a thermally resistant color filter that can withstand temperatures up to 300° C. However, even with thermally stable color filters such as those reported by Hong et al., the TFT array must be built using deposition techniques that do not require susceptor temperatures exceeding 300° C. This temperature limitation is a drawback because conventional TFT manufacturing techniques rely on susceptor temperatures that are above the temperature limits for even the previously discussed high temperature color filter. Substrate temperature will be lower than susceptor temperature since the susceptor is the actively heated element in a standard chamber, such as the AKT 1600 PECVD (Applied Materials, Santa Clara, Calif.). How much lower depends on the process and hardware conditions. Use of susceptor temperatures substantially below 400° C. results in less desirable TFT performance characteristics. It is likely that these less desirable performance characteristics can be correlated with film properties, such as gate insulator peeling, gate insulator layers with reduced insulating qualities, as well as reduced phosphine incorporation in the source and drain regions of the TFT. These undesirable results are better understood by first examining the structure of a typical TFT.

There are several types of TFTs that may be used in display devices. These types include coplanar TFTs, staggered TFTs, semi-staggered TFTs, reverse staggered TFTs (inverted staggered bilayers or inverted staggered trilayers), back-channel-etched inverted staggered structures. Staggered bilayers and inverted staggered trilayers are discussed in Hiranaka et al., 1989, *Jpn. J. Appl. Phys.* 28, 2197; and Kuo, 1991, *J. Electrochem. Soc.* 138, p. 637. Back-channel-etched inverted staggered structures are discussed in Cheng, 1997, *J. ElectroChem. Soc.* 144, p. 2929. FIG. 2 shows a cross-sectional view of a reverse-staggered TFT. This TFT has a gate electrode 202 formed on a substrate 201. Optionally, the entire surface of the gate electrode 202 is covered with an anodic oxide film 203. A gate insulating film 204 is formed on top of gate 202. A polycrystalline or amorphous silicon film 205 is formed over the gate insulating film 204. The TFT is completed by forming source region 209a and a drain region 209b, which are doped with impurity ions, as well as a channel region 209, which is not doped with impurity ions. The channel region 209 is interposed between the source region 209a and the drain region 209b and formed opposite the gate electrode 202. An insulating protective film 206a is formed above the channel region 209, while a source electrode 210a and a drain electrode 210b are formed on the source region 209a and the drain region 209b, respectively.

Depending on the gate metal used in the TFT and the substrate temperature during processing, lower substrate temperatures result in poor adhesion of the gate insulating film 204 on the gate metal 202 (FIG. 2). Subsequent peeling of the gate insulating film 204 compromises the insulating properties of the film.

Another reason low-temperature processing is not desirable is that such processing results in a decrease in substrate temperature relative to conventional deposition processes. This decrease in surface temperature yields a gate insulating film having a lower density. Low density gate insulating films have poorer insulating qualities relative to high density gate films and, as a consequence, they are undesirable.

Yet another consequence of using reduced processing temperatures, at least in the case of CVD deposition, is poor phosphine incorporation into the source and drain regions of the TFT. A variety of methods are used for forming the TFT source and drain regions. In one method, a $SiH_4$ gas containing an impurity gas, such as a $PH_3$ gas, is decomposed by discharge to deposit a $n^+$ a-Si film, thereby forming the source and drain regions. In another method, a gas containing impurities, such as a hydrogen diluted $PH_3$ gas, is ionized by discharge and the resulting ions are accelerated and implanted into an a-Si film without mass separation in order to form a doped film, such as a $n^+$ a-Si film, thereby forming the source and drain regions. This method is referred to as an ion shower doping method and is described in, for example, Japanese Patent Laid-Open Publication Nos. 63-194326, 4-39967, 5-243270, and 6-37110. Other techniques for phosphorous doping are disclosed in U.S. Pat. No. 5,576,229 to Murata et al. However, conventional phosphorous doping is more difficult at low temperatures. This is evidenced by higher resistivity in the source and drain regions of the TFT. To circumvent this problem, higher $PH_3$ concentrations in the feed gas may be used during ion implantation to compensate for the reduced phosphine incorporation. However, in many situations, even the use of higher $PH_3$ amounts in the feed gas is insufficient to increase conductivity.

Given the above background, there is a need in the art to compensate for the decreased TFT performance with CVD films grown at lower than typical temperatures. In particular, there is a need in the art for improving the adhesion of the gate insulating film on the gate metal, improving the electrical characteristics of the gate insulating film, improving the resistivity of the TFT source and drain regions, and improving TFT stress characteristics.

SUMMARY OF THE INVENTION

In summary, the present invention provides techniques for improving the fabrication of TFTs on low-cost, large-area substrates at low processing temperatures. The present invention provides a novel method for preparing gate metal prior to gate insulator deposition. In the novel method, gate metal is pre-treated with an $H_2$ plasma in order to promote adhesion of the subsequently deposited gate insulator. Pretreatment of the gate metal prior to deposition of the gate insulator eliminates peeling of the insulator. Further, the present invention provides methods for improving the electrical characteristics of the gate insulating layer. It has been discovered that the layers of the gate insulator that are nearest to the active a-Si layer (FIG. 2, channel region 209) are most important in determining the electrical properties of the gate insulator layer.

Accordingly, the present invention provides a dual layer approach for forming a gate insulating layer. In this dual layer approach, a high quality g-SiN film serves as an interface to the active layer while a lower stress SiN layer serves as an underlayer. The high quality layer maintains desirable TFT characteristics whereas the underlayer serves to minimize overall stress. The dual layer approach is advantageous because it takes less time to deposit the hybrid gate insulating layer, thereby improving overall throughput. Finally, the present invention provides a deposition method for incorporating phosphine into the source and drain regions of a TFT. In this deposition method, a $SiH_4$ gas containing an impurity gas, such as $PH_3$, is decomposed by discharge to deposit a $n^+$ a-Si film, thereby forming the source and drain regions. It has been unexpectedly discovered that reducing the RF power relative to conventional deposition methods increases the incorporation of phosphine into the a-Si film, thus resulting in desirable resistivity.

One aspect of the present invention provides a method of fabricating a thin-film transistor. In the method, a gate metal is deposited over a substrate in order to form the gate of the thin-film transistor. In one embodiment, the substrate is made of a material such as glass or quartz. In another embodiment, the substrate is a color filter. Next, the gate is subjected to an $H_2$ plasma. Finally, a gate insulating film is deposited on the gate. In some embodiments, the thin-film transistor is a polysilicon thin-film transistor or an amorphous silicon thin-film transistor. In some embodiments, the thin-film transistor is a reverse staggered TFT. Further, in some embodiments, a color filter serves as the TFT substrate. Thus, in some embodiments of the invention, a gate metal is deposited directly onto a color filter.

In some embodiments, the gate is subjected to the $H_2$ plasma for a period of up to ten minutes. In other embodiments, the gate is subjected to the $H_2$ plasma for a period of four minutes to seven minutes. In some embodiments, no $H_2$ dilution is used. In some embodiments, the RF power of the plasma enhanced chemical vapor deposition (PECVD) chamber that is used to support the $H_2$ plasma is between about 0.025 Watts/cm$^2$ and about 0.5 Watts/cm$^2$. In some embodiments, the RF power that is used to support the $H_2$ plasma is in the range of about 0.05 Watts/cm$^2$ to about 0.25 Watts/cm$^2$. In some embodiments, the pressure of the PECVD while the gate is subjected to the $H_2$ plasma is between about 0.3 Torr and about three Torr.

Another aspect of the present invention provides a method of fabricating a thin-film transistor for use in a TFT-based display device. The thin-film transistor has an insulative substrate such as quartz or glass or the substrate is a color filter. In the method, a gate metal is deposited onto the substrate in order to form the gate of the thin-film transistor. Next, a first layer of a gate insulating film is deposited on the gate. Finally, a second layer of a gate insulating film is deposited onto the first layer of gate insulating film. In some embodiments, the first layer of gate insulating film has lower stress than the second layer of gate insulating film, which interfaces with the semiconductor layer. Further, the second insulating layer has better electrical properties than the first insulating layer. In some embodiments, the first layer of gate insulating film is deposited at a higher deposition rate than the first layer, thereby providing manufacturing throughput advantages.

In another aspect of the present invention, a method is provided of making a thin film transistor having an $n^+$ silicon film that forms source and drain regions on a substrate. In the method, an $n^+$ silicon film is formed on the substrate inside a plasma enhanced chemical vapor deposition (PECVD) chamber. The $n^+$ silicon film is formed on the substrate by maintaining a flow of silane, phosphine and hydrogen gas into the chamber during a time when the substrate is maintained at a temperature of about 300° C. or less and the RF power of the PECVD chamber is less than $C_1 \times 400$ watts, where $C_1$=[size of the PECVD susceptor/200,000 mm²]. In some embodiments, the n+ silicon film is made of amorphous silicon. In some embodiments:

(i) the flow rate of the silane into the deposition chamber is between ($C_1 \times 100$ standard cubic centimeters per minute) and ($C_1 \times 1000$ standard cubic centimeters per minute);

(ii) the flow rate of the phosphine is between ($C_1 \times 1.5$ standard cubic centimeters per minute) and ($C_1 \times 10$ standard cubic centimeters per minute); and (iii) the flow rate of the hydrogen is between ($C_1 \times 400$ standard cubic centimeters per minute) and ($C_1 \times 900$ standard cubic centimeters per minute).

In some embodiments, the n+ silicon film has a resistance of less than about 240 ohm cm and the PFCVD radio frequency power used during n+ silicon film deposition is less than $C_1 \times 300$ watts. In some embodiments, the n+ silicon film is formed at a rate of between 80 Angstroms/minute and 900 Angstroms/minute. In some embodiments, the susceptor size is 400×500 mm² and $C_1$ is one.

Another embodiment of the present invention provides a thin film transistor that is integrated onto the same substrate as a color filter, the thin film transistor having an n+ silicon film that forms source and drain regions on the substrate. The n+ film is formed inside a plasma enhanced chemical vapor deposition (PECVD) chamber by maintaining a flow of silane, phosphine and hydrogen gas into the chamber during a time when the substrate is maintained at a temperature of about 300° C. or less and the RF power of the PECVD chamber is less than $C_1 \times 400$ watts.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

The present invention provides methods for producing TFTs at low temperatures. Low temperature TFT fabrication processes are advantageous in the manufacture of TFT-based display devices because the TFT array can be built directly onto the color filter, thereby reducing manufacturing costs. The inventive methods address many of the obstacles that arise when conventional TFT fabrication techniques are run at temperatures below 400° C. Such obstacles include insulator layer peeling, unacceptably high TFT resistivities, and insulator layers with unacceptable film stress.

$H_2$ plasma treatment of gate metal prior to gate insulator deposition. A first aspect of the present invention provides a novel $H_2$ plasma treatment of gate metal prior to gate insulator deposition. Depending on the gate 202 (FIG. 2) metal and the substrate 201 temperature, lower substrate temperatures can result in poor adhesion of the gate insulator film 204 on the gate metal. Subsequent peeling of the film compromises the insulator. It has been unexpectedly discovered that pretreatment of the gate metal with an $H_2$ plasma promotes adhesion of the subsequently deposited gate insulator and precludes peeling. Furthermore, it has been found that $N_2$ and $N_2O$ plasmas are not effective in preventing peeling of the gate insulator. Accordingly, one aspect of the present invention provides a method of fabricating a TFT. Typically, the TFT is used in devices such as a liquid crystal display (LCD).

The order of the steps used to manufacture a TFT in the instant invention will vary depending on whether the TFT is a coplanar, staggered, semi-staggered, reverse staggered, is a back-channel-etched inverted staggered structure (see, e.g., Tsai, 1997, *J. Electrochem. Soc.* 144, p. 2929), or has some other configuration. The order of steps taken when the TFT is a reversed staggered TFT will be described. Those of skill in the art will appreciate how to change the order of the steps taken when other TFT configurations are used. In the first step, a gate metal is deposited onto a substrate. The substrate may be made of any suitable material, such as glass or quartz. In one embodiment, the substrate is made of low-temperature, low-Na glass. In another embodiment, a color filter serves as the substrate. Color filter are described, for example, in U.S. Pat. No. 6,323,920, which is fully incorporated by reference herein. The gate metal is any suitable TFT gate metal. Exemplary gate metals include, but are not limited to, Mo, Ta, Cr, Ti, Al, Cu, Ta—Mo, Mo—W, or Cr—Ni. In one embodiment, the gate metal is aluminum, aluminum alloy, copper, and copper alloy. A particularly suitable aluminum alloy is Al—Nd. The gate metal is deposited onto the substrate using any of a number of techniques including, but not limited to, sputtering or evaporation. See, for example, Van Zant, 2000, *Microchip Fabrication*, Fourth edition, McGraw-Hill, New York.

Figure 1:
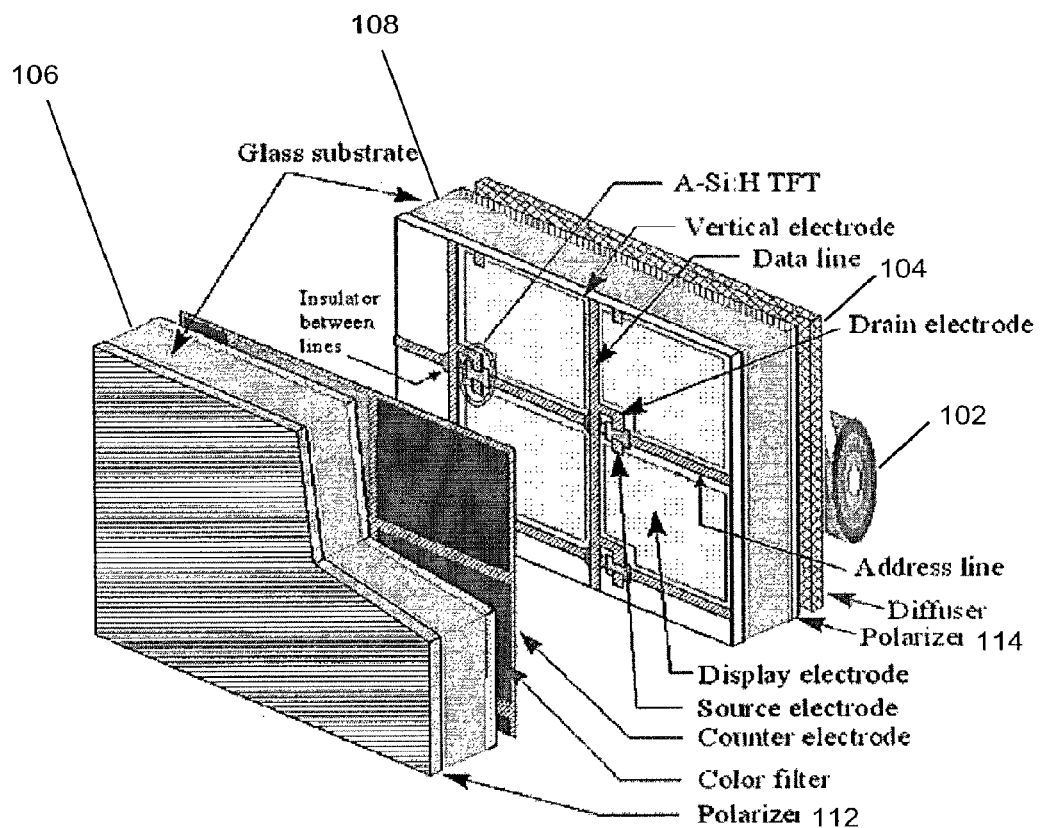
FIG. 1 illustrates an active matrix liquid crystal display in accordance with known art.
Figure 2:
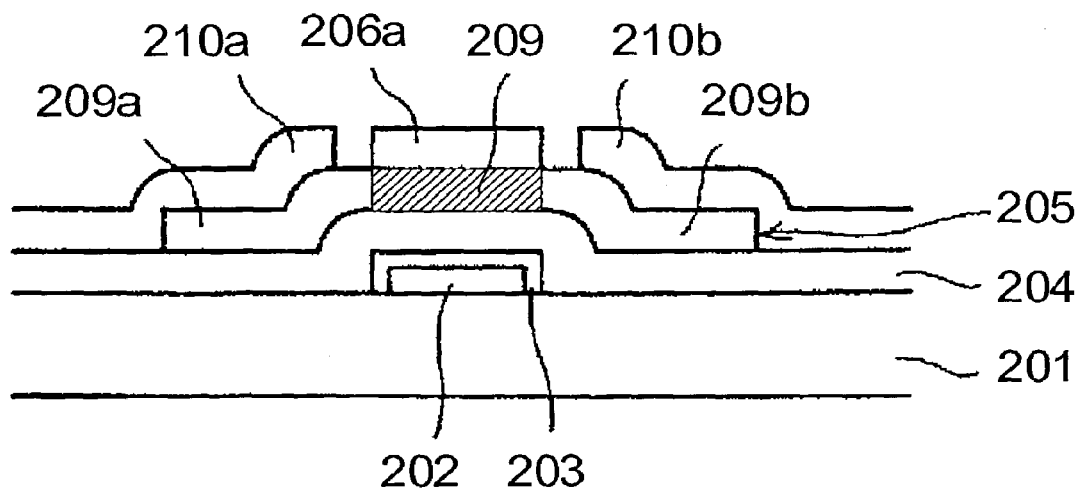
FIG. 2 illustrates a cross-sectional view of a reverse-staggered TFT.
Figure 3:
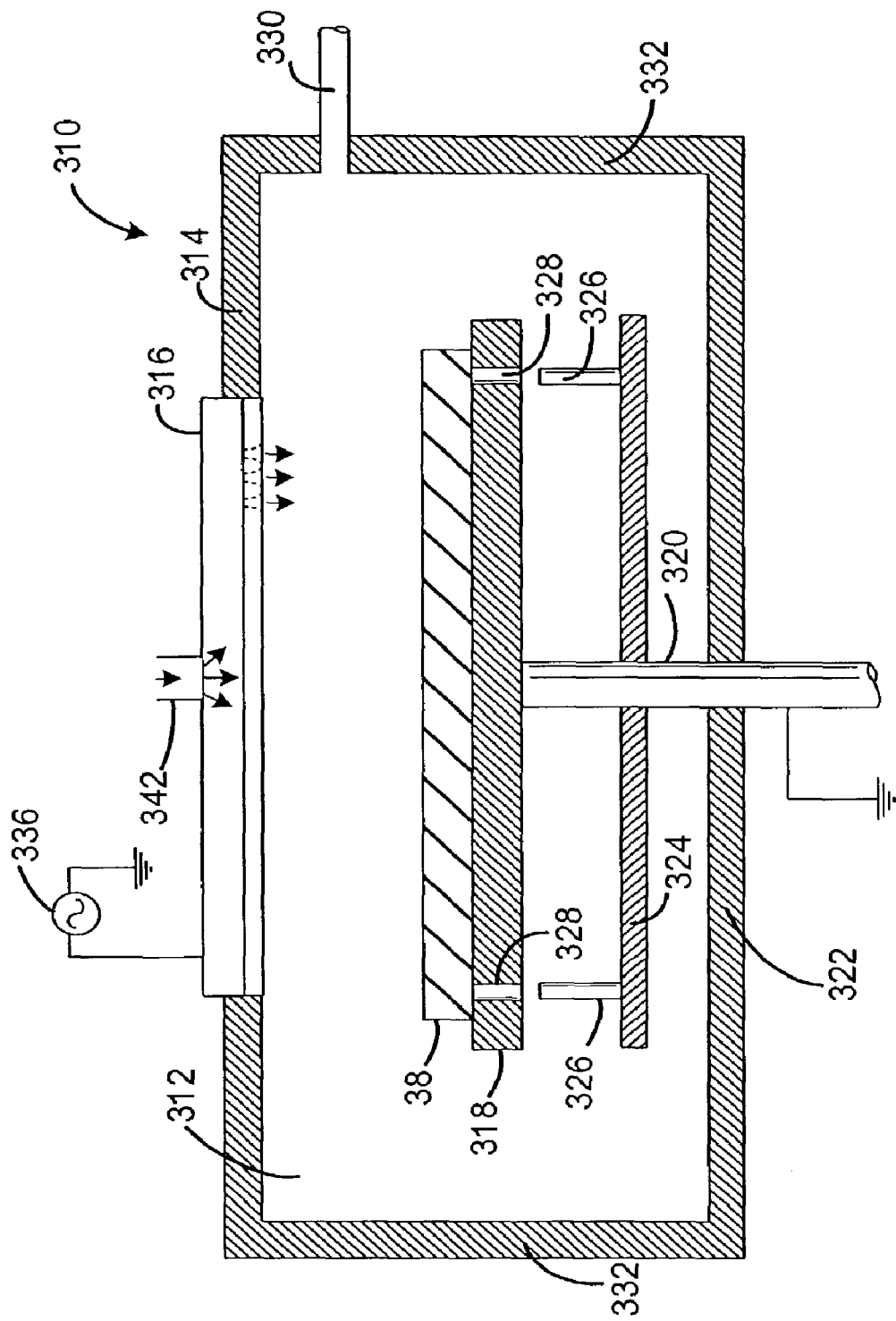
FIG. 3 illustrates a PECVD chamber in accordance with known art.

After the gate metal has been formed on the substrate, the gate metal is subjected to an $H_2$ plasma for a period of time. In some embodiments, the gate metal is subjected to an $H_2$ plasma prior to forming the gate. In other embodiments, the gate metal is subjected to an $H_2$ plasma after the gate metal has been patterned to form a gate. To form a gate, a thin film of metal is deposited on a substrate. Then, the thin film of metal is patterned by photolithography in a desired shaped to from the gate electrode. The structure of an exemplary gate electrode is gate electrode 202 (FIG. 2). A plasma enhanced chemical vapor deposition (PECVD) reactor may be used to subject the gate metal on the substrate to an $H_2$ plasma. Such reactors are disclosed in Van Zant, Id. Exemplary PECVD reactors that may be used in accordance with the present invention include barrel radiant-heated PECVDs, horizontal-tube PECVDs, and high density plasma CVDs. In addition, the AKT PECVD systems, including the 1600PECVD, 3500PECVD, 4300PECVD, 5500PECVD, and the 10K PECVD may be used (Applied Materials, Santa Clara, Calif.). FIG. 3 illustrates an exemplary PECVD reactor that may be used in accordance with the methods of the present invention. The reactor includes a deposition chamber 312 that has an opening across a top wall 314 as well as a first electrode 316 within the opening. In some instances, electrode 316 is a gas inlet manifold while in other instances, wall 314 is solid and electrode 316 is adjacent to the inner surface of top wall 314.

Within chamber 312 there is a susceptor 318 in the form of a plate that extends parallel to electrode 316. Susceptor 318 is connected to ground so that it serves as a second electrode. Susceptor 318 is mounted on the end of a shaft 320 that extends vertically through a bottom wall 322 of deposition chamber 312. Shaft 320 is movable vertically so as to permit the movement of susceptor 318 vertically toward and away from electrode 316. A lift-off plate 324 extends horizontally between susceptor 318 and bottom wall 322 of deposition chamber 312 substantially parallel to susceptor 318. Lift-off pins 326 project vertically upwardly from lift-off plate 324. The lift-off pins 326 are positioned to be able to extend through holes 328 in susceptor 318, and are of a length slightly longer than the thickness of the susceptor 318.

A gas outlet 330 extends through a side wall 332 of deposition chamber 312. Gas outlet 330 is connected to means (not shown) for evacuating the deposition chamber 312. A gas inlet pipe 342 extends through the first electrode or the gas inlet manifold 316 of the deposition chamber 312, and is connected through a gas switching network (not shown) to sources (not shown) of various gases. Electrode 316 is connected to a power source 336. Power source 336 is typically an RF power source.

In the operation of PECVD reactor 310, a substrate is first loaded into deposition chamber 312 and is placed on susceptor 318 by a transfer plate (not shown). One size of substrate used for thin film transistor substrates 38 is a 400 mm by 500 mm glass panel. However, unlike semiconductor manufacturing arts, the insulative substrate (glass, quartz, etc.) industry has not standardized on specific insulative substrate sizes. Accordingly, substrates processed by deposition apparatus 310 may in fact be any size, such as 550 mm by 650 mm, 650 mm by 830 mm, 1000 mm by 1200 mm or larger. Further, when a color filter is used as a substrate, it will be appreciated that the size of the substrate will be determined by the dimensions of the color filter.

The length of time the substrate with the gate metal is subjected to an $H_2$ plasma depends on the exact specifications of the gate metal and the substrate. It will be appreciated that, in the interest of expediting the manufacture of TFT devices, effective short exposures to the $H_2$ plasma are more desirable than longer exposures. Accordingly, in one embodiment, the substrate having the gate metal is exposed to an $H_2$ plasma in a PECVD chamber for a period of up to ten minutes. In other embodiments, the substrate having the gate metal is exposed to an $H_2$ plasma in a PECVD chamber for a period of about 4 minutes to about 7 minutes. However, $H_2$ plasma exposures of any length of time are contemplated by the present invention provided that such exposures are effective at preventing the peeling of the insulator from the gate metal and such exposures do not damage the substrate or gate metal.

In embodiments where a PECVD chamber is used to expose the gate metal to an $H_2$ plasma, a radio-frequency-induced glow discharge, or other plasma source is used to induce a plasma field in the $H_2$ gas. In embodiments where a radio-frequency-induced glow discharge is used to generate the $H_2$ plasma, the radio-frequency (RF) power during at least a portion of the exposing step is between about 50 watts and about 1 kilowatt when the substrate size is 400 mm×500 mm. In some embodiments, the RF power that is used to support the RF $H_2$ plasma is in the range of about 100 watts to about 500 watts when the substrate size is 400 mm×500 mm. Larger substrate sizes will require more power, such as 0.5, 1, 1.5 or 2 watts/cm² or more.

In embodiments where a PECVD chamber is used to expose the gate metal to an $H_2$ plasma, the pressure of the chamber is below atmospheric pressure. In fact, in one embodiment of the present invention, the pressure of the chemical vapor deposition chamber during at least a portion of the period of time in which the gate metal is exposed to $H_2$ plasma is less than 10 Torr. In fact, more typically, the pressure is between about 1 Torr and about 4 Torr or less. In embodiments where a PECVD chamber is used to expose the gate metal to an $H_2$ plasma, $H_2$ gas is supplied to the chamber at a flow rate of about 100 standard cubic centimeters per minute to about 10 standard liters per minute during at least a portion of the period of time in which the gate metal is exposed to $H_2$ plasma. In one embodiment, $H_2$ gas is supplied to the chamber at a flow rate of about 4 standard liters per minute. In a specific embodiment, the gate metal is exposed to the $H_2$ plasma for a period of two to seven minutes, and the $H_2$ gas is delivered to the PECVD chamber at a flow rate of about one to six liters per minute.

After the gate metal has been subjected to an $H_2$ plasma, a gate insulating film 204 (FIG. 2) is deposited on the gate. The insulating film may be any suitable insulator film known in the art. Representative insulator films include, but are not limited to $SiN_x$, $SiO_2$, $SiO_xN_y$, $Ta_2O_5$, $Al_2O_3$, and dual dielectrics. The insulating film may be applied using plasma enhanced CVD, atmospheric pressure CVD, sputtering, or anodization.

In the case of reverse staggered TFTs, after the gate insulating film has been deposited, the semiconductor layer (FIG. 2, 205) is deposited. The TFT that is built is typically characterized by the material used to make the semiconductor layer. For example, when the semiconductor layer is polysilicon thin-film, the TFT is referred to as a polysilicon thin-film transistor. In another example, when the semiconductor layer is amorphous silicon thin-film, the TFT is referred to as an amorphous silicon thin-film transistor. In one embodiment, the semiconductor layer is a thin layer of amorphous silicon containing hydrogen (a-Si:H). TFTs containing a thin layer of amorphous silicon containing hydrogen are referred to interchangeably as (a-Si:H) TFTs or a-Si TFTs. The term a-Si TFT refers to TFTs that include an amorphous silicon layer that includes hydrogen. In another embodiment, the semiconductor layer is polysilicon or CdSe. The semiconductor layer may be deposited using plasma enhanced CVD, atmospheric pressure CVD, sputtering, anodization, or related techniques.

Once the semiconductor layer 205 has been added, source 209a and drain 209b regions are formed (FIG. 2). A variety of methods are used for forming the TFT source and drain regions. The source and drain regions may be formed using the semiconductor layer, or a doped semiconductor may be added to the existing semiconductor layer. In one method in which doped layers are added to the existing semiconductor layer, a $SiH_4$ gas containing an impurity gas, such as a $PH_3$ gas, is decomposed by discharge to deposit an n⁺ a-Si film, thereby forming the source and drain regions. In another method, a gas containing impurities, such as a hydrogen diluted $PH_3$ gas, is ionized by discharge and the resulting ions are accelerated and implanted into an a-Si film without mass separation in order to form a doped film, such as an n⁺ a-Si film, thereby forming the source and drain regions. Other techniques for forming source and drain regions are known in the art. In one embodiment, for a-Si:H TFTs, source and drain regions are formed by depositing, via PECVD, a heavily phosphorus-doped (P-doped) silicon film between the a-Si:H and the source and drain electrodes (FIG. 2, 210a and 210b). In one embodiment, source and drain electrodes 210a and 210b are formed by depositing a metal such as titanium, which is then patterned by photolithography. For more details on TFT fabrication at conventional temperatures, see U.S. Pat. No. 5,576,229, which is hereby incorporated by reference.

The manufacturing steps for making a TFT in accordance with the present invention have been disclosed. Accordingly, one aspect of the present invention provides a thin-film transistor having a substrate with a gate on the substrate. In one embodiment, the substrate is made of glass or quartz. In another embodiment, the substrate is a color filter. The TFT further includes a gate insulating film that is formed on the gate. However, before the gate insulating film is formed on the gate, the gate is subjected to an $H_2$ plasma. TFTs in accordance with this aspect of the invention are polysilicon, amorphous silicon, or CdSe thin-film transistors. That is, the semiconductor layer 205 (FIG. 2) is made of polysilicon, amorphous silicon, or CdSe. Further, TFTs in accordance with this aspect of the invention include an insulating film that is made of an insulator such as, for example, $SiN_x$, $SiO_2$, $SiO_xN_y$, $Ta_2O_5$, or $Al_2O_3$. One specific embodiment provides a thin-film transistor where the thin-film transistor is a reverse staggered TFT that is used in an LCD.

Dual layer gate insulator. A second aspect of the present invention provides a novel method for reducing stress in the gate insulator layer 204 (FIG. 2). The decrease in substrate temperature that is necessary for the efficient manufacture of TFTs in devices such as active matrix displays results in substantial changes to the gate insulator layer. In particular, lower gate insulator layer deposition temperatures decrease the insulating qualities of the film.

Low-temperature processing is difficult because the resultant reduced substrate surface temperature yields a gate insulating film having a lower density. Low density gate insulating films have poorer insulating qualities relative to high density gate films and, as a consequence, they are undesirable. To circumvent this undesirable result, a novel approach in accordance with the present invention employs $H_2$ dilution In this approach, plasma enhanced chemical vapor deposition (PECVD) or CVD is used to deposit a $SiN_x$, $SiO_2$, $SiO_xN_y$, $Ta_2O_5$ or $Al_2O_3$ film (FIG. 2, film 204). During deposition, the PECVD or CVD chamber is filled with an $H_2$ or argon gas in order to dilute the plasma. In one embodiment of the present invention, $H_2$ or argon gas is introduced into the PECVD or CVD chamber at a flow rate of between 100 sccm and 8000 sccm. In another embodiment of the present invention, $H_2$ or argon gas is introduced into the PECVD or CVD chamber at a flow rate of about 200 to 5000 sccm. In still another embodiment, $H_2$ or argon gas is introduced into the PECVD or CVD chamber at a flow rate of about 300 to about 4000 sccm.

$H_2$ dilution is advantageous because it results in higher density insulative films. However, undesirable high compressive film stress within the gate insulating film is one drawback to this approach. Too much compressive film stress can cause the substrate to bow excessively, thus preventing automated handling of the substrates. Automated handling of the substrates is required for efficient substrate processing. To address this problem, the present invention exploits the observation that the electrical properties of a TFT largely depend on the 500 Angstroms to 1000 Angstroms of insulating film that is closest to the semiconductor layer 205 (FIG. 2). In this novel approach, a high quality insulating film that has high stress is overlayed with a low quality insulating film that has low stress in order to form a dual layer insulator that has good TFT electrical characteristics and acceptable overall film stress. In reverse staggered TFTs, the low quality low stress film is deposited first. Then, the high quality high stress film is deposited onto the low quality film to form a dual insulating layer that has acceptable overall stress characteristics.

The insulating quality of a gate insulator layer is a function of the density of the layer. At lower substrate processing temperatures, the density of the material is reduced, thereby reducing the quality of the insulating layer. As discussed above, a novel processing technique increases the density of gate insulating layers by feeding $H_2$ or argon gas ($H_2$ dilution) into the reaction chamber during insulating layer deposition. However, gate insulating layers that are formed using $H_2$ dilution at substrate temperatures of about 400° C. or less typically have a compressive stress that is greater than desirable. Therefore, one embodiment of the present invention provides a method of reducing compressive film stress in the gate insulating layer in a thin film transistor even when the substrate temperature is 400° C. or less during processing. The steps in this method will be described for the manufacture of a reverse-staggered TFT. However, those of skill in the art will appreciate that the order of the steps may be changed in order to manufacture other TFT configurations.

In the method of the present invention, the thin-film transistor has an insulative substrate such as glass or quartz or the substrate is a color filter. A gate metal is deposited onto the substrate and processed in order to form the gates of an array of thin-film transistors using techniques described above and that are found in references such as Van Zant, Id. Next, a first layer of a gate insulating film is deposited on the gates. Typically, the first layer of gate insulating film is deposited under conditions that will yield a film that has reduced compressive film stress. Therefore, in some embodiments, the first layer of gate insulating film is deposited at a reduced deposition rate so that the compressive film stress is less than about $1 \times 10^9$ dyne/cm$^2$. In some embodiments, the first layer of gate insulating film is deposited at a reduced deposition rate so that the compressive film stress is less than about $5 \times 10^9$ dyne/cm$^2$. Then, a second layer of gate insulating film is deposited onto the first layer of gate insulating film at a second deposition rate thereby forming the gate insulating layer. Generally, the deposition of the second layer of gate insulating film results in a second layer of gate insulating film having a thickness of between about 500 Angstroms and about 1200 Angstroms.

The second layer of gate insulating film is deposited under $H_2$ or argon dilution conditions. In some embodiments, the deposition rate used to form the second layer is less than the deposition rate used to form the first layer. Therefore, the second layer of gate insulating film has improved insulation qualities relative to the first layer of gate insulating film. However, the improved insulation quality of the second layer of gate insulating film is derived at the expense of film stress. The second layer of gate insulating film has a film stress that is in the range of about $1 \times 10^9$ dyne/cm$^2$ to about $20 \times 10^9$ dyne/cm$^2$. In some embodiments, the second layer of gate insulating film has a film stress that is in the range of about $6 \times 10^9$ dyne/cm$^2$ to about $16 \times 10^9$ dyne/cm$^2$.

Although other deposition techniques are possible, in one embodiment of the present invention, the deposition of the first layer of gate insulating film and the deposition of the second layer of gate insulating film are performed in a chemical vapor deposition (CVD) chamber or a plasma enhanced chemical vapor deposition (PECVD) chamber. Further, the deposition of the second layer of gate insulating film, and optionally the first layer of gate insulating film, are performed under $H_2$ or argon dilution conditions. $H_2$ dilution conditions and argon dilution conditions are respectively defined herein as the introduction of $H_2$ or argon gas into the CVD or PECVD chamber at a deposition rate of between about 50 sccm and 5000 sccm. In some embodiments, the $H_2$ or argon dilution conditions are provided by introducing an $H_2$ or argon gas into the CVD or PECVD chamber during at least a portion of time in which the second layer is deposited. In order to increase manufacturing efficiency, the susceptor temperature during at least a portion of the deposition of the first layer and the second layer is about 400° C. or less. This allows for configurations in which the color filter is fused directly to an array of TFTs that are used in a TFT-based display device.

The first layer of the gate insulating film and the second layer of the gate insulating film are each independently made of insulating materials such as, for example, SiNx, SiO$_2$, SiO$_x$N$_y$, Ta$_2$O$_5$ or Al$_2$O$_3$.

In some embodiments of the present invention, the inventive technique is used to build an amorphous silicon thin-film transistor or a polysilicon thin-film transistors. Further, in some embodiments of the present invention, the insulative substrate is glass or quartz.

Now that the general process conditions for this aspect of the invention have been described, specific examples are provided. In these examples, several different SiN layers are made using the process conditions described in Table 1 below. The susceptor temperature used in all experiments was 290° C. This results in a substrate temperature of 250° C. An AKT 1600PECVD was used for each run described in Table 1 (Applied Materials, Santa Clara, Calif.). In Table 1, columns two through five respectively provide the relative flow rates of SiH$_4$, NH$_3$, N$_2$, and H$_2$ that are applied during the deposition of the SiN film. Column six is the RF power density of the PECVD that was used during deposition of the SiN film while column 7 provides the pressure used. Column 8 shows the SiN film deposition rate, in Angstroms per minute. Finally, column 9 shows the compressive stress of the SiN film in 10$^9$ dyne/cm$^2$. Compressive film stress was measured using a Tencor FLX-2320 (KLA-Tencor, San Jose, Calif.). The Tencor FLX-2320 contains two solid-state lasers: a Class IIIA laser with 4 mW power at 670 nm wavelength and a Class IIIB laser with 4 mW power at 750 nm wavelength. The system can measure stress on all reflecting films.

compressive stress of the insulative film have been disclosed. Accordingly, one aspect of the present invention provides TFTs that have been manufactured using these novel techniques. Such TFTs are typically made as a TFT array that is used in a display device such as an active matrix display. The use of susceptor temperatures below 400° C. improves the efficiency by which such display devices are manufactured. The thin-film transistor comprises an insulative substrate, a gate formed on the insulative substrate, as well as first and second gate insulating films. The first and second gate insulating films are deposited onto the gate to form an insulating layer. The second gate insulating film is deposited at a deposition rate that is less than the deposition rate used to form the first gate insulating film. Further, the second gate insulating film has a higher film compressive stress than the gate insulating film. In one embodiment of the present invention, the second gate insulating film has a thickness of between about 500 Angstroms and about 1200 Angstroms. However, the exact thickness of the second gate insulating film is application dependent. Accordingly, the thickness of the second gate insulating film may be about 200 to about 300 Angstroms, about 300 to about 500 Angstroms, about 500 Angstroms to about 1250 Angstroms, or more than 1250 Angstroms. In some embodiments, the second gate insulating film has a compressive film stress of about 10×10$^9$ dyne/cm$^2$ to about 15×10$^9$ dyne/cm$^2$ or more. The first gate insulating film and the second gate insulating film are each independently made of a material such as, for example, SiNx, SiO$_2$, SiO$_x$N$_y$, Ta$_2$O$_5$ or Al$_2$O$_3$. In some embodiments, the thin-film transistor is an amorphous silicon thin-film transistor or a polysilicon thin-

TABLE 1

Process Conditions

| Film Type | SiH$_4$ (ratio) | NH$_3$ (ratio) | N$_2$ (ratio) | H$_2$ (ratio) | RF (W/cm$^2$) | Pressure (Torr) | D/R (Å/min) | Stress (e$^9$ D/cm$^2$) |
|---|---|---|---|---|---|---|---|---|
| SiN | 1 | 5 | 32 |    | 0.5 | 1.2 | 1000 | 3.6 |
| SiN | 1 | 5 | 32 | 40 | 0.5 | 1.2 | 710 | 10.8 |
| SiN | 1 | 5 | 32 | 40 | 0.6 | 1.2 | 790 | 11.1 |
| SiN | 1 | 3 | 32 | 40 | 0.6 | 1.2 | 790 | 12.5 |
| SiN | 1 | 5 | 32 | 40 | 0.6 | 1.2 | 780 | 15.2 |

Each row in Table 1 provides the process conditions for a different SiN film. The compressive film stress of each film was measured. The first row of data in Table 1 provides process conditions that are representative of the first layer of gate insulating film. H$_2$ dilution conditions are not used and a relatively rapid deposition rate is used to form this SiN film. Thus, the SiN film produced using the process condition describe in the first row of data in Table 1 do not have very good insulating properties. However, the film does have very good compressive film stress (3.6×10$^9$ dynes/cm$^2$). The remaining process conditions listed in Table 1 do use H$_2$ dilution conditions and relatively slower deposition rates. Accordingly, while the films produced using these process conditions have good insulating properties, they have a high compressive film stress (10.8×10$^9$ dynes/cm$^2$-15.2×10$^9$ dynes/cm$^2$). Therefore use of process conditions such as those disclosed in the first line of Table 1, to produce an insulating underlayer (first layer), and process conditions such as any of those disclosed in subsequent lines in Table 2, to produce an insulating overlayer (second layer), will yield an insulating bilayer that has acceptable overall film stress and good electrical insulating properties.

Novel methods for fabricating an insulative film for TFTs at substrate temperatures below 400° C. while minimizing the film transistor. Further, in some embodiments, the insulative substrate used is quartz or glass.

Low resistivity n$^+$ doped a-Si films. A third aspect of the present invention is directed to techniques for improving the doping of TFT source and drain regions. The inventive techniques may be used, for example, in deposition methods where a SiH$_4$ gas containing an impurity gas, such as a PH$_3$ gas, is decomposed by discharge to deposit a n$^+$ a-Si film. This n$^+$ a-Si film serves as the source and drain regions in a TFT. Lower TFT processing temperatures (below 400° C.) make phosphine incorporation difficult in such deposition methods. This is evidenced by higher TFT resistivity. Often, higher PH$_3$ concentrations in the feed gas are not sufficient to increase TFT conductivity. However, it has been unexpectedly discovered that reducing the RF power relative to conventional deposition methods increases the incorporation of phosphine into an n$^+$ a-Si film that serves as the source and drain regions of a TFT. The increased phosphine incorporation into the n$^+$ a-Si film improves (decreases) TFT resistivity.

Figure 4A:
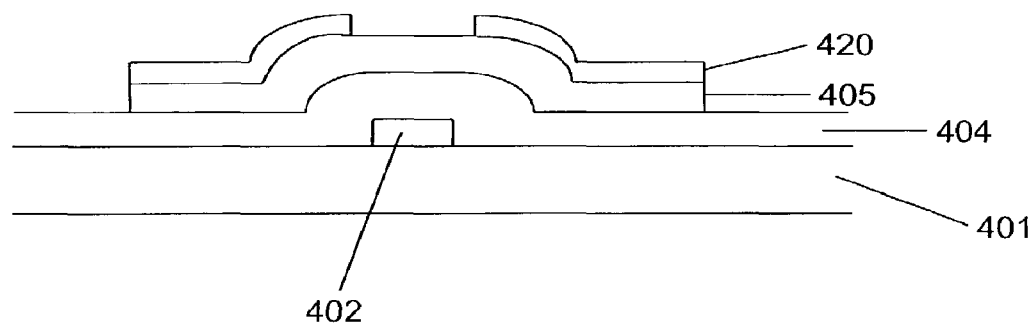
FIGS. 4A and 4B illustrate the manufacture of a reverse-staggered TFT in accordance with some embodiments of the present invention.
Figure 4B:
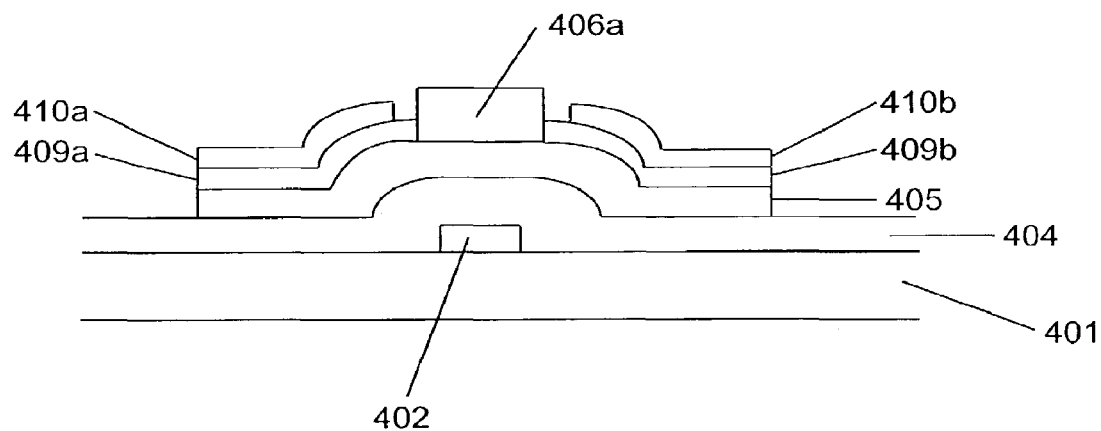

One embodiment of the present invention provides a method of fabricating a thin film transistor having an n$^+$ silicon film that is used as the source and drain regions of a TFT. In the method, an n silicon film is formed on the substrate. Typically, as in the case of the reverse staggered TFT configuration (FIG. 4A), the gate 402, an insulative layer 404, and a semiconductor layer 405 are deposited on the substrate 401 before the n+ silicon film 420 is deposited. The n+ silicon film 420 then serves as the source and drain regions (FIG. 4B; 409a, 409b) of the TFT. Referring to FIG. 4B, the TFT is completed by forming the source and drain electrodes (410a, 410b) and the insulating protective film 406a.

The n+ silicon film (FIG. 4A, 420) is deposited by maintaining a positive flow of silane, phosphine and hydrogen gas in a PECVD reaction chamber during a time when the substrate is maintained at a temperature of about 300° C. or less. In some embodiments, the substrate is maintained at a temperature of about 250° C. or less. In some embodiments, the substrate is an insulative substrate such as glass or quartz. In some embodiments, the substrate is a color filter. In the case where an AKT 1600PECVD is used and the susceptor size of the PECVD chamber is 400 mm×500 mm$^2$, the RF power of the PECVD chamber during the deposition process is less than 400 watts. The maximum power is increased when larger PECVD susceptors are used. Thus, a more general expression of the maximum power is $C_1 \times 400$ watts, where $C_1$=[PECVD susceptor size/200,000 mm$^2$]. In one embodiment, the n+ silicon film is made of amorphous silicon.

The flow rate of the silane, phosphine, and hydrogen will vary depending on the size of the PECVD chamber used. A number of studies have been done using a 400×500 mm$^2$ susceptor in a 1600PECVD system (Applied Materials, Santa Clara, Calif.). It is generally the case that flow rates may be scaled as a function of the surface area of the susceptor (susceptor size). Thus, flow rates may be optimized on the 1600PECVD for 400×500 mm$^2$ sized susceptors and scaled to larger sized susceptors by multiplying the silane, phosphine, and hydrogen flow rates by $C_1$, where $C_1$=[PECVD susceptor size used/200,000 mm$^2$]. Here, the value 200,000 mm$^2$ is the area of a 400×500 m$^2$ susceptor. With this in mind, one embodiment of the present invention provides a method for forming a n+ silicon film on a substrate by maintaining a flow of silane, phosphine and hydrogen gas into a PECVD reaction chamber during a time when the PECVD susceptor is maintained at a temperature of about 250° C. or less and the RF power of the PECVD chamber is less than $C_1 \times 400$ watts. The flow rate of silane into the deposition chamber is between ($C_1 \times 100$ standard cubic centimeters per minute) and ($C_1 \times 1000$ standard cubic centimeters per minute). Further, the flow rate of phosphine is between ($C_1 \times 1.5$ standard cubic centimeters per minute) and ($C_1 \times 10$ standard cubic centimeters per minute). In some embodiments, the phosphine is 0.5% balanced in a carrier gas that has a flow rate between ($C_1 \times 300$ standard cubic centimeters per minute) and ($C_1 \times 2000$ standard cubic centimeters per minute). Finally, the flow rate of the hydrogen is between ($C_1 \times 400$ standard cubic centimeters per minute) and ($C_1 \times 900$ standard cubic centimeters per minute).

An advantage of this aspect of the present invention is that the resistance of the n silicon film is reduced even when the film is deposited at substrate temperatures of 250° C. or less. The amount of RF power used in known techniques that are run at susceptor temperatures of 250° C. or less yields TFTs that have resistivity exceeding 240 ohm cm, which is unacceptably high. Using the techniques of the present invention, TFTs can be manufactured at low susceptor temperatures and still produce TFTs that have a resistance that is less than about 240 ohm cm or even less than about 160 ohm cm. To accomplish this, the PECVD radio frequency power is constrained so that it is less than $C_1 \times 300$ watts, where $C_1$ is size of the susceptor used in the PECVD chamber divided by 200,000 mm$^2$. In some embodiments, the PECVD radio frequency power is constrained so that it is less than $C_1 \times 200$ watts during source and drain region deposition. These parameters yield n+ silicon film deposition rates of between about 80 Angstroms/minute and about 900 Angstroms/minute or less. In some embodiments, the parameters used yield deposition rates of between 100 Angstroms/minute and 700 Angstroms/minute or less.

Now that general processing parameters have been described for this aspect of the invention, a number of examples are provided. In each of the examples provided below, the susceptor size is 400×500 nm$^2$. Furthermore, an AKT 1600PECVD system (Applied Materials) was used to perform the processing.

Example 1

Processing was performed at a substrate temperature of 250° C. and an RF power of 400 watts. Silane gas flow into the PECVD chamber was 400 standard cubic centimeters per minute (sccm). PH$_3$ was 0.5% balanced in a carrier gas. The gas flow of this PH$_3$ mixture into the PECVD chamber was 1000 sccm. Hydrogen gas flow into the PECVD chamber was 500 sccm. The reaction resulted in the formation of an n+ doped amorphous silicon film at a deposition rate of 830 Angstroms/minute. The resistance of the resulting n doped amorphous silicon film was 140 ohm cm.

Example 2

Processing was performed at a substrate temperature of 250° C. and an RF power of 150 watts. The gas flow of silane into the PECVD chamber was 240 standard cubic centimeters per minute (sccm). PH$_3$ was 0.5% balanced in a carrier gas. The gas flow of this PH$_3$ mixture into the PECVD chamber was 600 sccm. The gas flow of hydrogen into the PECVD chamber was 600 sccm. The reaction resulted in the formation of the n+ doped amorphous silicon film at a deposition rate of 570 Angstroms/minute. The resistance of the resulting n+ doped amorphous silicon film was 120 ohm cm.

Example 3

Processing was performed at a substrate temperature of 150° C. and an RF power of 100 watts. The gas flow of silane into the PECVD chamber was 200 standard cubic centimeters per minute (sccm). PH$_3$ was 0.5% balanced in a carrier gas. The gas flow of this PH$_3$ mixture into the PECVD chamber was 400 sccm. The gas flow of hydrogen into the PECVD chamber was 800 sccm. The reaction resulted in the formation of the n+ doped amorphous silicon film at a deposition rate of 120 Angstroms/minute. The resistance of the resulting n+ doped amorphous silicon film was 220 ohm cm.

Example 4

In this example, a number of process conditions were tested. All depositions were performed at a susceptor temperature of 300° C. Columns 1 through 3 of Table 2 respectively provide the silane relative flow rate, 0.5% balanced PH$_3$ relative flow rate, and H$_2$ relative flow rate used in the fabrication of a n+ doped a-Si film. Column 4 is the RF power density of the PECVD chamber (AKT 1600 PECVD) that was used while column 5 is the deposition rate in Angstroms per minute. Column 6 indicates the pressure in the chamber during the reaction while column 7 provides the susceptor temperature. Finally, column 8 indicates the resistivity, in ohm cm, of the film after fabrication.

TABLE 2

| \multicolumn{8}{c}{Process conditions} |
| SiH$_4$ (sccm) | PH$_3$ (sccm) | H$_2$ (sccm) | RF (W/cm$^2$) | D/R (Angstroms/min) | Pressure (Torr) | T$_{susc}$ (°C.) | Resistivity (ohm cm) |
| --- | --- | --- | --- | --- | --- | --- | --- |
| 1 | 3 | 0.75 | 0.2 | 810 | 1.2 | 290 | 204 |
| 1 | 2 | 1.75 | 0.2 | 810 | 1.2 | 290 | 155 |
| 1 | 2.5 | 1.25 | 0.15 | 720 | 1.2 | 290 | 237 |
| 1 | 2.5 | 2.5 | 0.075 | 570 | 1.4 | 290 | 109 |
| 1 | 3.33 | 1.67 | 0.075 | 550 | 1.4 | 290 | 138 |
| 1 | 3.5 | 100 | 0.6 | 220 | 2.1 | 290 | 6656 |

Taken together, the results in the Table 2 indicate that a reduction in RF power improves the resistivity of the n+ doped a-Si film.

Alternate Embodiments and References Cited

All references cited herein are incorporated herein by reference in their entirety and for all purposes to the same extent as if each individual publication or patent or patent application was specifically and individually indicated to be incorporated by reference in its entirety for all purposes. While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of forming on a substrate a gate insulator for a thin film transistor, comprising the steps of:
    depositing a lower layer of gate insulating film on a substrate; and
    depositing an upper layer of gate insulating film directly on the lower layer;
    wherein a first one of said layers of gate insulating film has a less compressive film stress and a lower density than the other one of said layers of gate insulating film.

2. The method of claim 1, wherein said first layer has a compressive film stress less than 109 dyne/cm2.

3. The method of claim 1, further comprising the steps of:
    forming a gate metal on the substrate; and
    forming on the substrate a semiconductor layer having drain and source regions;
    wherein said first layer of gate insulating film is between the gate metal and the second layer of gate insulating film; and
    wherein said other layer of gate insulating film is between the first layer of gate insulating film and the semiconductor layer.

4. The method of claim 1, wherein:
    said first layer is the lower layer of gate insulating film; and
    said other layer is the upper layer of gate insulating film.

5. The method of claim 1, wherein:
    said first layer is the upper layer of gate insulating film; and
    said other layer is the lower layer of gate insulating film.

6. The method of claim 1, wherein each step of the method is performed while the substrate is on a susceptor having a temperature less than or equal to 400 degrees C.

7. The method of claim 1, wherein each step of the method is performed while the substrate has a temperature less than or equal to 400 degrees C.

8. The method of claim 1, wherein said other layer of gate insulating film is silicon nitride.

9. The method of claim 1, wherein the step of depositing said other layer of gate insulating film further comprises supplying silane gas, ammonia gas and nitrogen gas into the chamber at respective flow rates effective to deposit silicon nitride on the substrate.

10. The method of claim 1, wherein said other layer of gate insulating film is deposited with a thickness of 200 to 500 angstroms.

11. The method of claim 1, wherein said other layer of gate insulating film is deposited with a thickness of 500 to 1200 angstroms.

12. The method of claim 3, wherein:
    said first layer is the lower layer of gate insulating film; and
    said other layer is the upper layer of gate insulating film.

13. The method of claim 3, wherein:
    said first layer is the upper layer of gate insulating film; and
    said other layer is the lower layer of gate insulating film.

14. The method of claim 4, further comprising the steps of:
    depositing a gate metal on the substrate before depositing the lower layer of gate insulating film so that the lower layer of gate insulating film is deposited over the gate metal; and
    depositing a semiconductor layer over the upper layer of gate insulating film.

15. A gate insulator for a thin film transistor, comprising:
    a lower layer of gate insulating film; and
    an upper layer of gate insulating film directly overlying the lower layer;
    wherein a first one of said layers of gate insulating film has a less compressive film stress and a lower density than the other one of said layers of gate insulating film.

16. The gate insulator of claim 15, wherein said first layer has a compressive film stress less than 109 dyne/cm2.

17. The gate insulator of claim 15, further comprising:
    a gate metal layer; and
    a semiconductor layer;
    wherein said first layer of gate insulating film is between the gate metal layer and the second layer of gate insulating film; and
    wherein said other layer of gate insulating film is between the first layer of gate insulating film and the semiconductor layer.

18. The gate insulator of claim 15, wherein:
    said first layer is the lower layer of gate insulating film; and
    said other layer is the upper layer of gate insulating film.

19. The gate insulator of claim 15, wherein:
    said first layer is the upper layer of gate insulating film; and
    said other layer is the lower layer of gate insulating film.

20. The gate insulator of claim 15, wherein said other layer of gate insulating film is silicon nitride.

21. The gate insulator of claim 15, wherein said other layer of gate insulating film has a thickness of 200 to 500 angstroms.

22. The gate insulator of claim 15, wherein said other layer of gate insulating film has a thickness of 500 to 1200 angstroms.

* * * * *